United States Patent [19]
Yanagimoto et al.

[11] Patent Number: 5,774,085
[45] Date of Patent: Jun. 30, 1998

[54] APPARATUS AND METHOD FOR OBTAINING PROPER OUTPUT SIGNAL IN WHICH GAIN AND DC COMPONENT ARE REGULATED BASED UPON ON MEASURED AMPLITUDE DISTRIBUTION

[75] Inventors: Yoshiyuki Yanagimoto; Mitsuhiro Nakamura, both of Hyogo, Japan

[73] Assignee: Hewlett-Packard Company, Palo Alto, Calif.

[21] Appl. No.: 916,718

[22] Filed: Aug. 18, 1997

Related U.S. Application Data

[63] Continuation of Ser. No. 527,327, Sep. 12, 1995, abandoned.

[30] Foreign Application Priority Data

Sep. 14, 1994  [JP]  Japan .................................. 6-247194

[51] Int. Cl.[6] .......................................................... H03G 3/00
[52] U.S. Cl. ................................................ 341/155; 341/120
[58] Field of Search ..................................... 341/118, 120, 341/155

[56] References Cited

U.S. PATENT DOCUMENTS 4,573,038  2/1986  Carbrey ..................................... 341/118
4,982,191  1/1991  Ohta ......................................... 341/118
5,245,340  9/1993  Loo et al. ................................. 341/118
5,438,460  8/1995  Coker et al. ............................... 360/46

FOREIGN PATENT DOCUMENTS 2-192250  7/1990  Japan .

*Primary Examiner*—Jeffrey A. Gaffin
*Assistant Examiner*—Peguy JeanPierre

[57] ABSTRACT

A circuit adjusts the gain, direct-current (DC) component, and transient response of input signals to provide suitable output signals for a connected signal processor. The circuit includes a gain and DC component control circuit, which controls the amplitude and DC offset level of an input signal; an A/D converter, which performs A/D conversion on the output of the gain and DC component control circuit; and an equalization filter, which is connected to the output of the A/D converter. The amplitude distribution of the output waveform of the equalization filter is measured, and the gain and DC component control circuit is controlled on the basis of said measured value, in order to assure that the output of the equalization filter is suitable for a connected signal processor.

5 Claims, 4 Drawing Sheets

APPARATUS AND METHOD FOR OBTAINING PROPER OUTPUT SIGNAL IN WHICH GAIN AND DC COMPONENT ARE REGULATED BASED UPON ON MEASURED AMPLITUDE DISTRIBUTION

This is a continuation of copending application Ser. No. 08/527,327 filed on Sep. 12, 1995.

FIELD OF THE INVENTION

This invention relates to a device and a method for obtaining suitable output signals from input signals by adjusting the gain, direct-current (DC) component, and transient response of a device and, more particularly, to a device and method for outputting suitable signals as input signals to a Viterbi decoder.

BACKGROUND OF THE ART

Viterbi decoders receive input signals that are not necessarily binary and output signals that have been decoded to binary form.

Digital signals obtained by analog/digital (A/D) conversion of analog input signals are ordinarily used as input signals to Viterbi decoders. But in order for the Viterbi decoder to perform decoding operations correctly, it is necessary for the amplitude and DC offset level of the analog input signal to be properly adjusted. In cases in which a number of signals, that are not necessarily binary, are input successively, the signals undergo interference from signals occurring both before and after, due to transient response. In order for the Viterbi decoder to perform decoding operations correctly, it is necessary to make interference between the signals a specific value by control of the transient response.

Therefore, in order for Viterbi decoder operations to be performed normally, the amplitude of the input signals are suitably adjusted by a gain control circuit 41 and the DC offset level is suitably adjusted by a DC component control circuit 42, as shown in FIG. 4. The adjusted signals are then subjected to A/D conversion by A/D converter 43 and the transient response is controlled by an equalization filter 44. The resulting signals are input to Viterbi decoder 45. Equalization filter 44 is of the digital type. However, when an analog filter is used, it may be inserted before A/D converter 43.

Gain control circuit 41 and the DC component control circuit 42 perform a method in which the output waveform from DC component control circuit 42 is observed by a waveform observation device, such as an oscilloscope and based on the observed waveform, gain control circuit 41 and DC component control circuit 42 are controlled by providing hand operated control signals to enable a suitable signal 49 to be fed to Viterbi decoder 45. In this case, the waveform displayed on the waveform observation device may be an eye pattern, obtained when the output waveforms of the DC component control circuit 42 are superimposed successively, each time a trigger input is applied, synchronized with said waveform. FIG. 5 shows an example of an eye pattern in the case in which the signal is a 2-valued signal.

In this method, however, even if A/D converter 43 converts its input signals correctly, when the waveform of the input signal to A/D converter 43 is observed with an oscilloscope, its amplitude distribution cannot be clearly distinguished, and therefore, input signal 49 to Viterbi decoder 45 cannot be controlled suitably. In general, an output waveform of the DC component control circuit 42 has fluctuations in both the magnitude and time directions. Therefore, in order to suitably control input signal 49 to Viterbi decoder 45, it is necessary to clearly distinguish the extent of the fluctuations in the magnitude direction, i.e., the amplitude distribution.

FIG. 6 shows an example of the waveform of the output from DC component control circuit 42 in a case in which the signal is binary. The right side of the figure shows the amplitude distribution of this waveform; it shows the number of times that amplitudes of each magnitude are produced within a specific time period. Fluctuations 64 and 65 make the waveform 61 thicker. When output signal 49 to Viterbi decoder 45 (FIG. 4) is made suitable by matching the "1" level to level A' and the "0" level to level B', one cannot see the accurate positions of either level "0" or level "1," due to the thickness of the waveform, even if one tries to do the matching. Therefore, the levels can only be approximately matched.

Peaks A and B in the amplitude distribution are the accurate positions of the levels "w" and "1," respectively, but with the conventional technology it is not possible to accurately control output signal 49, as th e amplitude distribution graph is lacking.

In the method described above, the waveform observed with the oscilloscope is the output waveform of DC component control circuit 42, but precisely speaking, it is the waveform of output signal 49 that should be observed. This is because there is no assurance that A/D converter 43 is converting its input signal correctly. However, since an analog signal is used as the input signal to the oscilloscope, the output waveform of DC component control circuit 42 is observed, instead of output signal 49 (the signal that must be observed). Therefore, this is also a factor that makes it difficult to accurately control output signal 49.

Another method for making the outputs of gain control circuit 41 and the DC component control circuit 42 suitable is a procedure known as "AGC," in which the amplitude and DC offset levels are detected in the output of DC component control circuit 42 by an amplitude detection means and a DC component detection means. Gain control circuit 41 and DC component control circuit 42 are then controlled on the basis of these values, so that a desired output signal 49 is obtained.

One can use a method for detecting the DC component by passing the output of DC component control circuit 42 through a low-pass filter, or a method for detecting and averaging the positive and negative peak values of the output of DC component control circuit 42. The detection of the peaks is generally performed by peak-detecting the waveform with a diode.

To detect the amplitude, one can use a method of passing the output of DC component control circuit 42 through a high-pass filter and detecting the positive peak value, and then taking twice the detected value as the amplitude, or employ a method of detecting the negative peak value in the same manner, and taking twice this detected value as the amplitude. There is also a method in which the positive and negative peak values of the output of DC component control circuit 42 are detected in the output, without passing it through a high-pass filter, and the difference between them is taken as the amplitude.

When the AGC method is used, even if A/D converter 43 converts its input signal correctly, there are problems that arise in the detection of the amplitude. If there are overshoots, etc., in the waveform of the output signal of DC component control circuit 42, and the positive and negative peak values are detected, the positive peak value becomes larger than the maximum value for the output signal, and the negative peak value becomes smaller than the minimum value for the output signal. As a result, the detected value of the amplitude of the output signal becomes larger than the real amplitude.

If the average value of the peak values is taken as the DC component, the detected value of the DC component will be distorted since the peak values are distorted by overshooting, etc. The detected value of the amplitude is used as the feedback to gain control circuit 41, but in such cases, since the detected value is larger than the actual amplitude, there will be an excess feedback, and the gain will be smaller than it should be. The DC component is used as the return to DC component control circuit 42, but in such cases, there is a possibility that the detected value will deviate from the actual value of the DC component, so that the feedback will not be accurate, and the DC component will deviate from the proper value.

This invention has the purpose of providing a device and a method for adjusting the gain, DC component, and transient response of a device receiving an input signal, in order to obtain a suitable output signal.

SUMMARY OF THE INVENTION

This invention employs gain and DC component control circuits, which control the amplitude and DC offset level of an input signal; an A/D converter, which performs A/D conversion on the output of the gain and DC component control circuits; and an equalization filter, connected to the output of the A/D converter. The amplitude distribution of the output waveform of the equalization filter is measured, and the gain and DC component control circuits are controlled on the basis of the measured value, in order to make the output of the aforementioned equalization filter suitable for input to a Viterbi decoder.

EXPLANATION OF SYMBOLS

Figure 1:
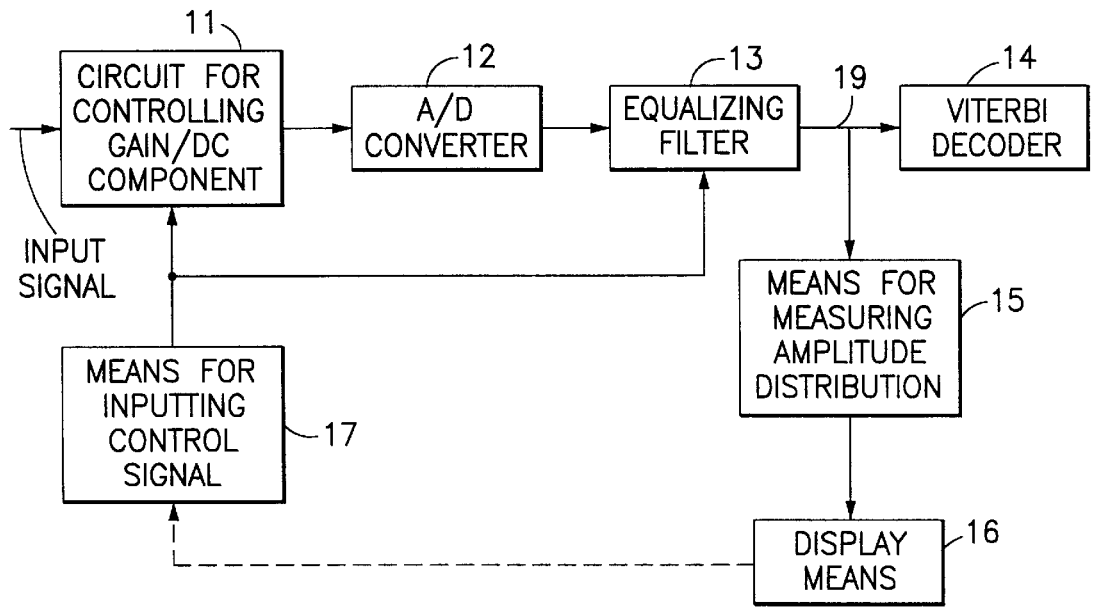
FIG. 1 is a block diagram of a circuit embodying the invention.

11: gain and DC component control circuit
12: A/D converter
13: equalization filter
14: Viterbi decoder
15: amplitude distribution measurement means
16: display means
17: control signal input means
18: control circuit generation means

DETAILED DESCRIPTION OF THE INVENTION

FIG. 1 shows a preferred embodiment of this invention. In this FIG., the gain and DC component applied to the input signal are controlled by gain and DC component control circuit 11. The controlled signal is then subjected to A/D conversion by A/D converter 12, after which, the transient response is controlled by equalization filter 13, and a resulting "suitable" signal 19 is fed to the Viterbi decoder 14.

The amplitude distribution of the output of equalization filter 13 is measured by a means for measuring amplitude distribution 15 and is displayed by display means 16. While the displayed amplitude distribution is observed, control signals are input to control signal input means 17, by hand. The control signals enable a suitable signal 19 to be sent to Viterbi decoder 14 by controlling gain and DC component control circuit 11 and equalization filter 13. The amplitude and the DC offset in the displayed amplitude distribution can be adjusted by controlling the gain and the DC component respectively. A rotary knob, keys, etc., can be used for input means 17. Further, while a Viterbi decoder 14 is shown in this example, but, it may also be another device.

Figure 3:
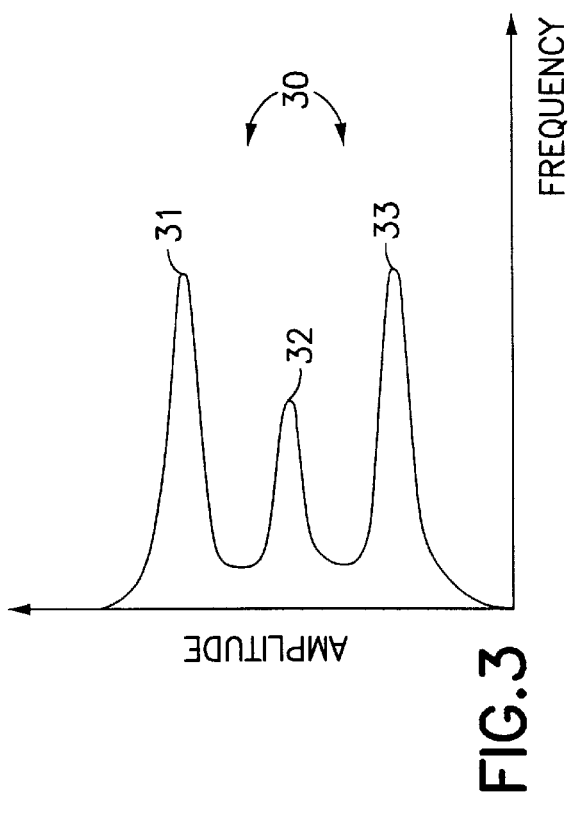
FIG. 3 is a diagram showing an example of an amplitude distribution displayed on a display means 16.
Figure 4:
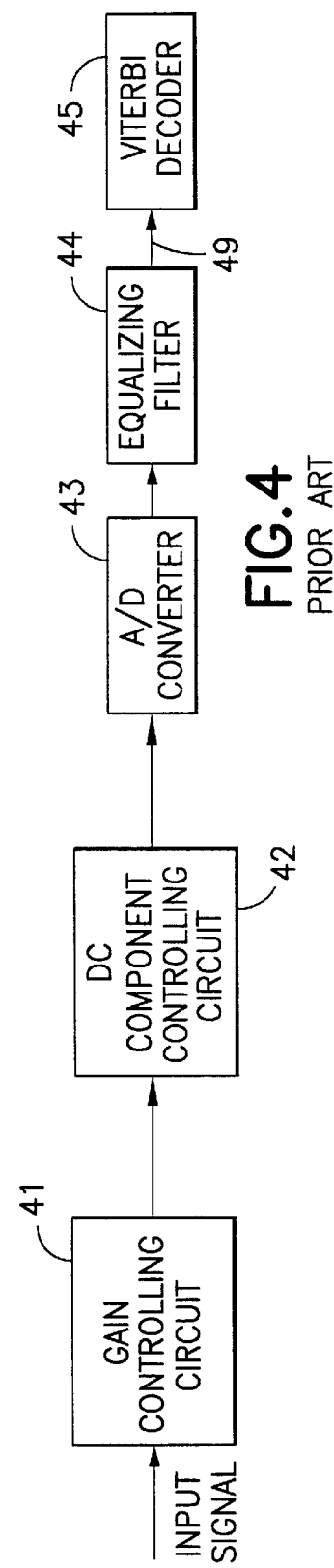
FIG. 4 is a block diagram of a system for processing an input signal to a Viterbi decoder.
Figure 5:
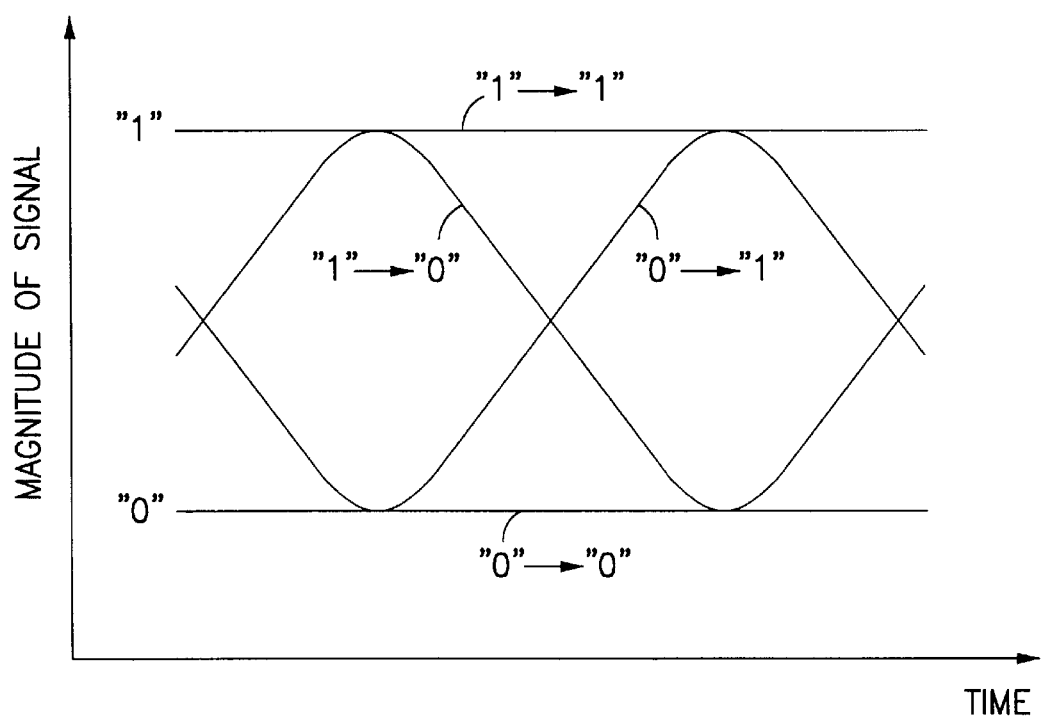
FIG. 5 is diagram showing an example in which an eye pattern of the output waveform of a DC component control circuit is displayed on an oscilloscope.
Figure 6:
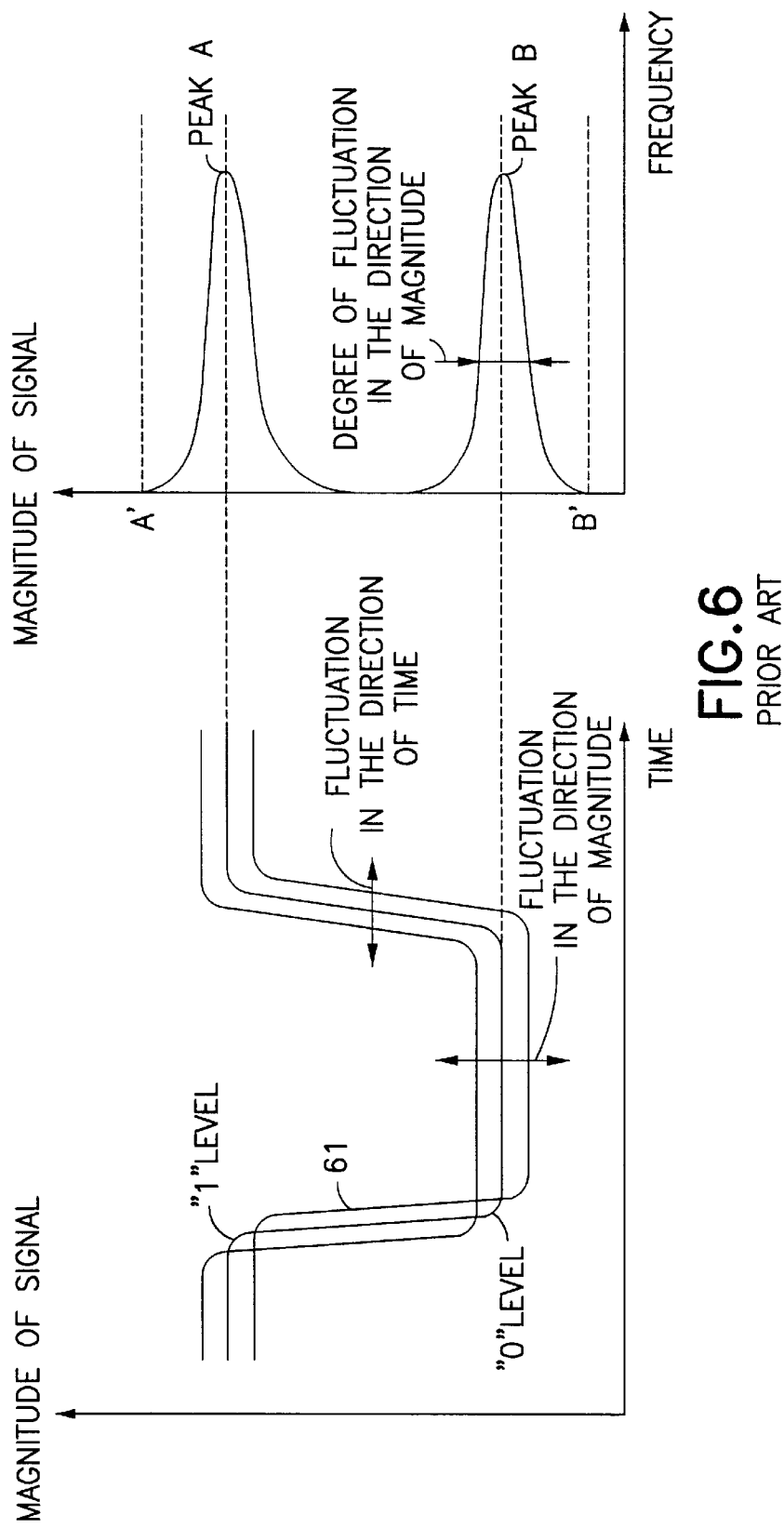
FIG. 6 is a diagram for explaining a waveform display when the output waveform (and amplitude distribution) of the DC component control circuit of FIG. 4 is observed by an oscilloscope.

FIG. 3 shows an example of the display of amplitude distribution by display means 16 in a case in which the input signal has 3 values (see peaks 31, 32 and 33). Among the peaks of the displayed amplitude distribution, the positions where the amplitude should be at its maximum and minimum are shown by markers 30. That is, when the positions of the two peaks 31 and 32 agree with the positions of the markers 30, the output signal 19 is "suitable".

By displaying the amplitude distribution, the fluctuations in the time direction become invisible, and the degree of fluctuation and peaks in the magnitude direction can be distinguished clearly. Therefore, control can be performed in such a way that these peaks have the desired magnitudes, and output signal 19 is easily and accurately controlled. Moreover, the degree of fluctuation in the magnitude direction can be easily distinguished by measuring the amplitude distribution.

The existence and effects of overshoot, etc., can be detected by measuring the amplitude distribution. Therefore, the feedback can easily be corrected.

Figure 2:
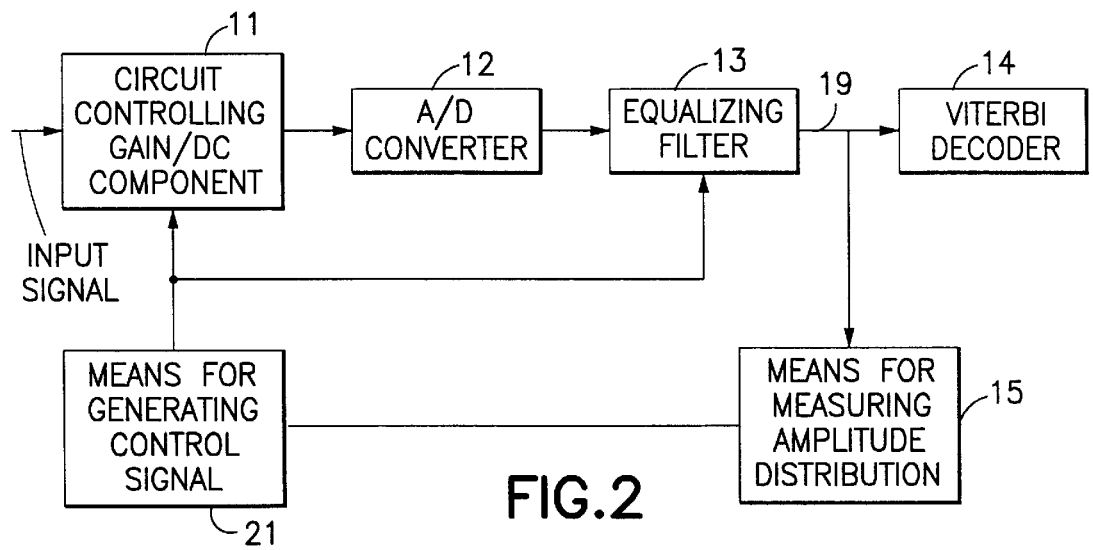
FIG. 2 is a block diagram of a further embodiment of the invention.

FIG. 2 shows a further embodiment of this invention. In this embodiment, there is the following difference when compared with FIG. 1. That is, the amplitude distribution of the output of equalization filter 13 is measured by a means for measuring amplitude distribution 15 and a control signal is generated by the control signal generation means 21 on the basis of the results of the measurement; gain and DC component control circuit 11 is automatically controlled, and a suitable signal 19 is fed to Viterbi decoder 14.

EFFECTIVENESS OF INVENTION

As explained above, this invention enables an input signal to be converted to a "suitable" output signal. Moreover, by using this output signal as the input signal to a Viterbi decoder, an erroneous decoding by the Viterbi decoder can be prevented.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A method comprising the steps of:
controlling a gain and direct-current component control circuit means to adjust amplitude and direct-current offset levels of an input signal;

performing A/D conversion on an output of said gain and direct-current component control circuit means to produce digital signals:

equalization filtering said digital signals to produce filtered digital signals;

measuring an amplitude distribution of said filtered digital signals by determining a measure of each digital signal, sorting into groups each said digital signal in accord with said measure thereof and determining a number of digital signals which fall into each group; and controlling said gain and direct-current component control circuit means in dependence upon results of said measuring step to assure that said filtered digital signals exhibit a suitable signal characteristic which matches requirements of a connected signal processing means.

2. A method comprising the steps of:

controlling a gain and DC component control circuit means to adjust amplitude and DC offset levels of an input signal;

performing A/D conversion on an output of said gain and DC component control circuit means to produce digital signals:

equalization filtering said digital signals to produce filtered digital signals;

measuring an amplitude distribution of said filtered digital signals; and controlling said gain and DC component control circuit means in dependence upon results of said measuring step to assure that said filtered digital signals exhibit a suitable signal characteristic which matches requirements of a connected signal processing means.

3. A device for receiving an input signal train including plural signals which exhibit plural logical signal levels that evidence a variability over multiple occurrences of said plural signals, said device comprising:

a) gain and direct-current (DC) component control circuit means for controlling an amplitude and DC offset level of said plural signals;

b) signal processing means for processing output signals corresponding to said plural signals from said gain and DC component control circuit means;

c) means for measuring amplitude distribution of logical signal levels of plural ones of said output signals from said gain and DC component control circuit means, said means for measuring sampling said plural signals, determining a measure of each sample, sorting into groups each said sample in accord with said measure thereof and determining a number of samples which fall into each group; and d) means for controlling said gain and DC component control circuit means in dependence upon results of said measuring amplitude distribution so as to assure that said output from said gain and DC component control circuit means exhibits logical signal levels which match requirements of said signal processing means.

4. The device as recited in claim 3, wherein said means for controlling is connected to between said means for measuring amplitude distribution and said gain and DC component control circuit means and is automatically responsive to said results of said measuring amplitude distribution to provide control signals to said gain and DC component control circuit means.

5. A device for receiving an input signal train including plural signals which exhibit plural logical signal levels that evidence a variability over multiple occurrences of said plural signals, said device comprising:

a) gain and DC component control circuit means for controlling an amplitude and DC offset level of said plural signals;

b) an analog to digital (A/D) converter for performing A/D conversion of an output of said plural signals from said gain and DC component control circuit means;

c) signal processing means for processing of said plural signals from said A/D converter;

d) means for measuring amplitude distribution of logical signal levels of plural ones of said plural signals from said A/D converter, said means for measuring determining a measure of each sample from said A/D converter, sorting into groups each said sample in accord with said measure thereof and determining a number of samples which fall into each group; and e) means for controlling said gain and DC component control circuit means in dependence upon results of said measuring amplitude distribution so as to assure that said logical signal levels that are output from said A/D converter match requirements of said signal processing means.

* * * * *